| United States Patent [19] | [11] Patent Number: 4,818,070 |
| --- | --- |
| Gunjima et al. | [45] Date of Patent: Apr. 4, 1989 |

[54] LIQUID CRYSTAL OPTICAL DEVICE USING U.V.-CURED POLYMER DISPERSIONS AND PROCESS FOR ITS PRODUCTION

[75] Inventors: Tomoki Gunjima; Hiroshi Kumai; Minoru Akatsuka, all of Yokohama; Shoichi Tsuchiya, Sagamihara, all of Japan

[73] Assignee: Asahi Glass Company Ltd., Tokyo, Japan

[21] Appl. No.: 144,171

[22] Filed: Jan. 15, 1988

[30] Foreign Application Priority Data

Jan. 22, 1987 [JP] Japan ................................. 62-11237

[51] Int. Cl.$^4$ .............................................. G02F 1/13
[52] U.S. Cl. ................................. 350/334; 350/347 E; 350/347 V; 350/351; 427/12; 427/26; 427/54.1; 427/43.1
[58] Field of Search ............... 350/340, 347 V, 347 E, 350/351, 334; 427/12, 26, 54.1, 43.1

[56] References Cited

U.S. PATENT DOCUMENTS

| | | | |
| --- | --- | --- | --- |
| 4,048,358 | 9/1977 | Shanks | 350/351 X |
| 4,246,302 | 1/1981 | Benton et al. | 350/351 X |
| 4,411,495 | 10/1983 | Beni et al. | 350/347 V |
| 4,435,047 | 3/1984 | Fergason | 350/334 |
| 4,671,618 | 6/1987 | Wu et al. | 350/347 V |
| 4,685,771 | 8/1987 | West et al. | 350/347 V |
| 4,688,900 | 8/1987 | Doane et al. | 350/351 X |
| 4,728,547 | 3/1988 | Vaz et al. | 350/351 X |

*Primary Examiner*—Stanley D. Miller
*Assistant Examiner*—Richard Gallivan
*Attorney, Agent, or Firm*—Oblon, Fisher, Spivak, McClelland & Maier

[57] ABSTRACT

A liquid crystal optical device comprising a pair of substrates provided with electrodes and a layer containing a liquid crystal material sandwiched between the pair of substrates, wherein said layer is formed by irradiating light to a mixture of a liquid crystal material and a photo-curable compound selected so that the refractive index of the resulting cured product agrees to either the ordinary refractive index ($n_O$) or the extraordinary refractive index ($n_e$) of the liquid crystal material used, or the refractive index ($n_x$) of the liquid crystal material when it is randomly oriented, held between the pair of substrates provided with electrodes, to cure the photo-curable compound and fix the resulting phase separation of the liquid crystal material and the cured product, wherein said layer has at least a portion optically oriented by applying a voltage to the portion across the substrates during the irradiation of light to cure the photo-curable compound.

29 Claims, No Drawings

LIQUID CRYSTAL OPTICAL DEVICE USING U.V.-CURED POLYMER DISPERSIONS AND PROCESS FOR ITS PRODUCTION

The present invention relates to a liquid crystal optical device of light transmission and scattering type, and a process for its production.

BACKGROUND OF THE INVENTION

Heretofore, two modes i.e. a dynamic scattering (DS) mode and a phase change (PC) mode are known for liquid crystal optical devices utilizing light scattering as the operational principle. In the DS mode, a liquid crystal material having a conductive substance incorporated therein and having a nagative dielectric anisotropy is sealed in a pair of substrates treated for homogeneous or homeotropic alignment and provided with transparent electrodes, and it is designed to control two states i.e. a transmitting state when no voltage is applied and a state where a voltage higher than the threshold voltage is applied to cause dynamic scattering and thereby to reduce the transmittance. Whereas, in the PC mode, a cholesteric liquid crystal material is sealed in a pair of substrates provided with transparent electrodes, which are optionally treated for alignment, and it is designed to control two states i.e. a state of a neumatic phase in homeotropic alignment (transmitting) and a state of a cholesteric phase in focalconic or planar alignment (scattering) by the application or non-application of a voltage. Both the DS and PC modes have an advantage that a wide viewing angle is obtainable since no polarizing film is used in either mode. However, the DS mode has a drawback that since it is a current effect mode with a conductive substance added to the liquid crystal material, the power consumption is large and the reliability of the liquid crystal material is low. The PC mode has also a difficult problem such that since the operation voltage depends upon the ratio of the cell gap to the pitch of liquid crystals, a highly precise uniform gap is required to enlarge the display surface area.

On the other hand, H. G. Craighead et al. have disclosed in Appl. Phys. Lett., 40(1)22(1982) a method which utilizes the feature that liquid crystal has birefringence. Specifically, the liquid crystal is impregnated in a porous material, and by the application or non-application of an electric field, the refractive index of the liquid crystal is changed, whereby the transmittance and the scattering are controlled by adjusting the difference in the refractive index from the porous material. This method is useful in that the drawback of the DS and PC modes can be overcome in principle without employing polarizing films. Similar devices have been prepared by J. L. Fergason et al. who used nematic liquid crystal encapsulated by means of polyvinyl alcohol (U.S. Pat. No. 4,435,047), by K. N. Pearlman et al. who used liquid crystal having various latexes taken therein (European Patent Application Publication No. 156615), and by J. W. Doane et al. who used a method of dispersing liquid crystal in an epoxy resin, followed by curing (International Application Publication No. 85-4262).

The method of H. G. Craighead et al. had drawbacks that no adequate variation in the transmittance is obtainable and the preparation of a device is difficult because it employs a process of impregnating liquid crystal into a porous material and thus has problems such that the impregnation of the liquid crystal is difficult when there is irregularities in the size of pores of the porous material used and the proportional ratio between the porous material and the liquid crystal can not freely be selected. Likewise, the devices of J. L. Fergason et al. and K. N. Pearlman et al. had a drawback that they require patterning of electrodes for a display. This patterning of electrodes require many steps including coating of a resist on the electrodes, exposure to light, development and etching. Besides, this display was limited to a two value display (display by two levels of transmittance) of transmitting and not-transmitting as between a portion where electrodes face each other and a portion where no electrodes face each other. Further, it was impossible to display a character or design in a circular or rectangular frame. The device was of a type where the display is on only when a voltage is applied.

SUMMARY OF THE INVENTION

It is an object of the present invention to overcome the above-mentioned drawbacks inherent to the conventional methods.

The present invention provides a liquid crystal optical device comprising a pair of substrates provided with electrodes and a layer containing a liquid crystal material sandwiched between the pair of substrates, wherein said layer is formed by irradiating light to a mixture of a liquid crystal material and a photo-curable compound selected so that the refractive index of the resulting cured product agrees to either the ordinary refractive index ($n_0$) or the extraordinary refractive index ($n_e$) of the liquid crystal material used, or the refractive index ($n_x$) of the liquid crystal material when it is randomly oriented, held between the pair of substrates provided with electrodes, to cure the photo-curable compound and fix the resulting phase separation of the liquid crystal material and the cured product, wherein said layer has at least a portion optically oriented by applying a voltage to the portion across the substrates during the irradiation of light to cure the photo-curable compound.

The present invention also provides a process for producing a liquid crystal optical device, which comprises supplying a mixture of a liquid crystal material and a photo-curable compound selected so that the refractive index of the resulting cured product agrees to either the ordinary refractive index ($n_0$) or the extraordinary refractive index ($n_e$) of the liquid crystal material used, or the refractive index ($n_x$) of the liquid crystal material when it is randomly oriented, between a pair of substrates provided with electrodes and irradiating the mixture with light to cure the photo-curable compound and form a cured layer of the mixture, wherein a voltage is applied to at least a portion of the mixture across the substrates during the irradiation so that only said portion is optionally oriented upon curing.

DETAILED DESCRIPTION OF THE PREFERRED EMBODIMENTS

Now, the pressent invention will be described in detail with reference to the preferred embodiments.

In the device of the present invention, the liquid crystal material and the cured product are fixed in a fine heterogeneous state resulted from a homogeneously dissolved state of the liquid crystal material and the photo-curable compound by the photo-curing step, whereby the distribution of the liquid crystal material and the cured product is uniform, thus presenting a device having a high quality of the outer appearance with excellent productivity.

In the present invention, the refractive index of the cured product formed by the irradiation with light is adjusted to agree to either the ordinary refractive index ($n_o$) or the extraordinary refractive index ($n_e$) of the liquid crystal material used, or the refractive index ($n_x$) of the liquid crystal material when it is randomly oriented, in either the state where a voltage is not applied or the state where a voltage is applied. Thus, it is designed so that light is transmitted when the refractive index of the cured product agrees to the refractive index of the liquid crystal material and light is scattered (white turbidity) when the refractive index of the cured product does not agree to the refractive index of the liquid crystal material. With this characteristic, the liquid crystal optical device of the present invention is highly effective for use as a light-controlling device.

Further, by adjusting the refractive index of the cured product to $n_o$ or $n_e$, the device of the present invention may be designed so that when no electric field is applied, it is in a scattering state (i.e. a turbid state) due to the difference in the refractive index between the non-oriented liquid crystal material and the cured product, and when an electric field is applied, it is in a transmitting state as the liquid crystal substance is aligned so that the refractive index ($n_o$ or $n_e$) of the liquid crystal material agrees to the refractive index of the cured product obtained by photo-curing, thus presenting a device having an excellent reversible light controlling function.

When the curing is conducted while a voltage is applied to only a certain portion, optical orientation may be formed at such a portion. Usually, by conducting the curing under application of a voltage higher than the threshold voltage, such a portion can be made in a consistently light transmitting state.

The tendency for the formation of optical orientation varies depending upon the system comprising a photocurable compound and a liquid crystal material used. Therefore, even if a voltage higher than the threshold voltage is applied, it is not always possible to form a light transmitting state. In such a case, a voltage adequately higher than the threshold voltage may be applied, or the composition of the system may suitably be selected.

After the curing, light is transmitted through such a portion irrespective of application of a voltage. Thus, it is possible to display specific characters or designs without patterning of electrodes. It is also readily possible to enclose a letter, design or graph by a continuous frame. Thus, there will be merits that the freedom in the display will be expanded and the design of the display pattern can be facilitated.

At a portion cured without application of a voltage or under application of a voltage sufficiently lower than the threshold voltage, the light transmittance changes upon application of the voltage. If the irradiation is conducted under application of a voltage of a level insufficient to completely orient the liquid crystal material or if the irradiation is conducted under application of a voltage for a short period of time so that the curing proceeds to some extent, the liquid crystal molecules will be aligned substantially with inclination at a certain angle, on the average, to the substrates, whereby the light transmittance under non-application of a voltage will be higher than the surrounding portion having white turbidity, and it will be possible to have a display with an intermediate tone. Thus, a display like a photograph will be possible. If it is desired to obtain a display with an intermediate tone of a photograph, exposure may be conducted under application of a high voltage by using a negative or positive of the photograph, whereby a strongly irradiated portion will be in a light transmitting state and a weakly irradiated portion will be in a light scattering state. Thus, various intermediate tones may be produced depending upon the degrees of exposure. The portion in the scattering state can be controlled for scattering and transmitting by application of a voltage.

When such orientation is imparted, the voltage required to bring the device to a light transmitting state tends to be small, whereby it is possible to operate the device with a low voltage or it is possible to increase the response speed. For this purpose, it is possible to form such orientation over the entire area without any specific patterning and thereby to lower the voltage required for the operation of the device. For this purpose, it is necessary to form such orientation uniformly over a large area. This can preferably be accomplished by conducting the irradiation while applying a low voltage instead of minimizing the exposure. In this case, the higher the applied voltage during the irradiation is, the lower the voltage required for the operation of the device becomes. However, the light transmittance under non-application of a voltage increases, and the difference between the transmitting state and the scattering state tends to be small. Therefore, it is advisable to conduct the irradiation by applying a voltage close to or higher than the threshold voltage, which is suitably selected by experiments. Specifically, the voltage for this purpose is usually within a range of from 0.5 to 50 V. The exposure time is also influencial and may suitably be selected by experiments.

As mentioned above, the formation of such orientation by the applied voltage varies depending upon the system comprising the photo-curable compound and the liquid crystal material used. Therefore, there may be a case where even when a voltage higher than the threshold voltage, e.g. at 50 V is applied, it is not possible to obtain a constantly light transmitting state. The applied voltage during the curing operation may suitably be determined by experiments depending upon the particular system.

For the purpose of the low voltage operation, the dielectric constants of the liquid crystal optical device as measured under different applied voltages are preferably in the following relationship.

$$0 < (\epsilon - \epsilon_{OFF})/(\epsilon_{ON} - \epsilon_{OFF}) < 0.8$$

where $\epsilon$ is the dielectric constant of the liquid crystal optical device obtained by curing under application of a voltage to form a certain specific orientation over the entire area; $\epsilon_{ON}$ is the dielectric constant of the liquid crystal optical device obtained by curing under non-application of a voltage, as measured at a voltage capable of sufficiently aligning the liquid crystal molecules in a direction perpendicular to the substrates; and $\epsilon_{OFF}$ is the dielectric constant of the liquid crystal optical device obtained by curing under non-application of a voltage, as measured at a voltage lower than the threshold voltage for aligning the liquid crystal molecules. This value is particularly preferably within a range of from 0.1 to 0.6 from the practical stand point. To form a constantly light transmitting state as mentioned above, this value is adjusted to be at least 0.8.

It is particularly preferred to use a combination of a liquid crystal material having a positive dielectric anisotropy and a photo-curable compound selected so that the refractive index of the resulting cured product agrees to $n_0$ of the liquid crystal material used, because the alignment of the liquid crystal during the application of an electric field should preferably be perpendicular to the substrates to attain high transmittance.

Further, the device of the present invention may be designed so that the refractive index of the cured product formed by the photo-curing agrees to the refractive index ($n_x$) when the liquid crystal material is randomly oriented. Here, the "randomly oriented" is meant for a state where liquid crystal molecules are directed to various directions under the influence of the network of the cured product without being aligned in a direction parallel or perpendicular to the plane of the substrate. In this case, when no electric field is applied, the refractive index of the non-oriented (randomly oriented) liquid crystal material agrees to the refractive index of the cured product, and the device is in a transmitting state. Inversely, when an electric field is applied, the liquid crystal material is aligned, whereby the refractive index ($n_0$ or $n_e$) of the liquid crystal material will not agree to the refractive index of the cured product formed by the photo-curing, and the device will be in a scattering state (i.e. a turbid state). Thus, when no voltage is applied, the device will be transparent. However, the cured product formed by the photo-curing is present in a network form, and the liquid crystal is randomly oriented under the influence of this cured product, whereby it is difficult to obtain a uniform state. Namely, it is readily possible to obtain a uniform alignment in the case of the homogeneous or homeotropic alignment. Whereas, it is difficult to obtain a uniform random orientation, because microscopically or locally the state of orientation varies delicately thus presenting a difference in the refractive index, which in turn is likely to be observed as haze irregularities, although the random orientation is macroscopically random.

When cured under application of a voltage higher than the threshold voltage to a certain portion during the curing step, the device of this type will have such a portion being in a constantly scattering state. After the curibng, at such a portion, light is scattered irrespective of application of a voltage. Thus, it is possible to display a specific character or design without patterning electrodes.

Further, also in the case of this device, the liquid crystal molecules can be aligned substantially with inclination at a certain angle, on the average, to the substrates, either by conducting the irradiation under application of a voltage of a level insufficient to completely orient the liquid crystal material or by conducting the irradiation under application of a voltage in a short period of time to have the curing proceed to some extent. Thus, it is possible to obtain a display with an intermediate tone like a photograph, or to operate the device at a low voltage.

Also in this case, the formation of orientation by the applied voltage varies depending upon the system comprising a photo-curable compound and a liquid crystal material used. Therefore, it is preferred to determine the applied voltage by experiments depending upon the system comprising a photo-curable compound and a liquid crystal material used. Likewise, it is preferred to experimentally determine the applied voltage depending upon the desired orientation state.

In the present invention, the refractive index of the cured product and the refractive index (either $n_0$, $n_e$ or $n_x$) of the liquid crystal material should preferably be in exact agreement. However, they may not be in exact agreement and may substantially be in agreement so that the transmitting state is not adversely affected. Specifically, the difference in the refractive indices should preferably be not larger than 0.15. Namely, the cured product will be swelled by the liquid crystal material, whereby the refractive index of the cured product tends to be closer to the refractive index of the liquid crystal material than the original refractive index of the cured product, and light will be transmitted even if a difference of this degree exists between the refractive indices.

In the present invention, since a photo-curable compound is used, it is readily possible to form certain specific orientation at a desired portion. Namely, by placing a light-shielding mask on the rest of the substrate, it is possible to readily cure only the specific portion to form specific orientation.

This photo-curable compound may be any compound curable by infrared rays, visible rays, ultraviolet rays or electron beams. The light may be of any type so long as it is capable of facilitating the curing, and the curing can be conducted either by photons, electrons or heat.

Accordingly, the photo-curable compound may be cured by vinyl polymerization, addition polymerization, condensation polymerization, cation polymerization, anion polymerization or living polymerization. However, the condensation polymerization is usually not preferred, since it produces a substance which may deteriorates the liquid crystal material, such as water or a corrosive substance.

The polymerization system may be homogeneous or heterogeneous. For example, it may be a mixture of the photo-curable compound and the liquid crystal, or it may be a microcapsulated mixture of the photo-curable compound and the liquid crystal with polyvinyl alcohol. Otherwise, after the photo-curing under application of a voltage, the entire product may be heated for heat polymerization.

A photo-cure initiator may be added to the photo-curable compound used in the present invention in order to facilitate the curing. A device having excellent quality of the outer appearance and excellent reliability can be prepared with a compound photo-curable by a radical species. The photo-curable compound may be such that the compound itself is photo-reactive, or may be such that the curing is induced by a substance formed by the irradiation with light. Preferred are photo-curable vinyl compounds. Such compounds may be classified into those which are decomposed by the irradiation with light for curing and those which are polymerized by the irradiation with light for curing. Those curable by polymerization may further be divided into those which undergo dimerization by light and those which undergo polymerization to form polymers. Those belonging to the former have a cinnamoyl group or a cinnamylidene groups as the vinyl group, in many cases. For example, polyvinyl cinnamate, polycinnamylidene vinyl acetate or a phenylenediacrylate may be mentioned. The latter include monomers or oligomers which are activated by light and polymerize by themselves or with other polymers, oligomers or monomers for curing. As the vinyl group, an acryloyl-type, an allyl-type, a spirane-type or a vinylbenzene-type monomer, oligomer or polymer may be mentioned. Specifically, compounds having monofunctional and polyfunctional vinyl groups may be mentioned which are represented by, for example, a monoacrylate, a diacrylate, an N-substituted acrylamide, an N-vinylpyrrolidone, styrene and its derivatives, a polyol acrylate, a polyester acrylate, a urethane acrylate, an epoxy acrylate, a silicone acrylate, a fluoroalkyl acrylate, a polyacrylate having a polybutadiene structure, a polyacrylate having an isocyanuric acid structure, an acrylate having a hydantoin structure and an unsaturated cycloacetal.

In the present invention, such various photo-curable vinyl compounds are preferred. However, it is particularly preferred to use acryloyl compounds since they are excellent in the phase separation into the liquid crystal material and the cured product upon irradiation with light and in its uniformity, and the curing rate by the irradiation with light is high and the cured product is stable. Here, the acryloyl group of the acryloyl compounds may have the hydrogen atom at the α-position or β-position substituted by a phenyl group, an alkyl group, a halogen atom or a cyano group.

In the present invention, among these photo-curable vinyl compounds, those curable by polymerization upon irradiation with light, particularly those containing polymerizable oligomers, are preferred.

Specifically, such a photo-curable vinyl compound preferably contains from 15 to 70% by weight of an acryl oligomer having at least two vinyl groups, whereby the shrinkage due to curing after the photo-curing operation is minimum and fine cracks scarcely form in the liquid crystal optical device, and thus the moldability will be improved. If fine cracks increase, the light transmittance in a light transmitting state tends to decrease, and the performance of the device tends to be poor. The viscosity of this acryl oligomer is preferably from 150 to 50,000 cps at 50° C. If the viscosity is too high or too low, the moldability tends to be inferior.

For the rest of the photo-curable vinyl compound, a vinyl-type monomer may be employed. An acryl monomer is particularly preferred, since it has good compatibility with the acryl oligomer.

A preferred acryl oligomer useful for the present invention has the following formula I.

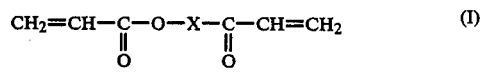

wherein X may be selected from units of e.g. a polyol, a polyester, an epoxy, a urethane or a hydantoin, which have an acrylic acid structure ($CH_2=CH-COO-$) at both ends. Specifically, X may have the following structures: $-R-O-_n$ such as $-CH_2CH_2O-_n$ or $-C_3H_6O-_n$

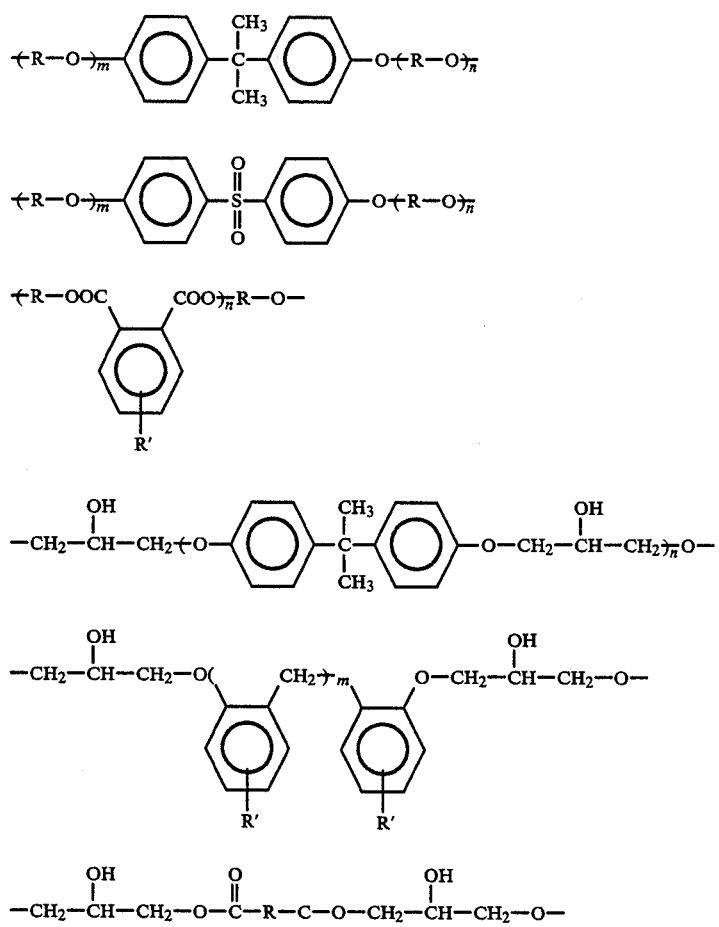

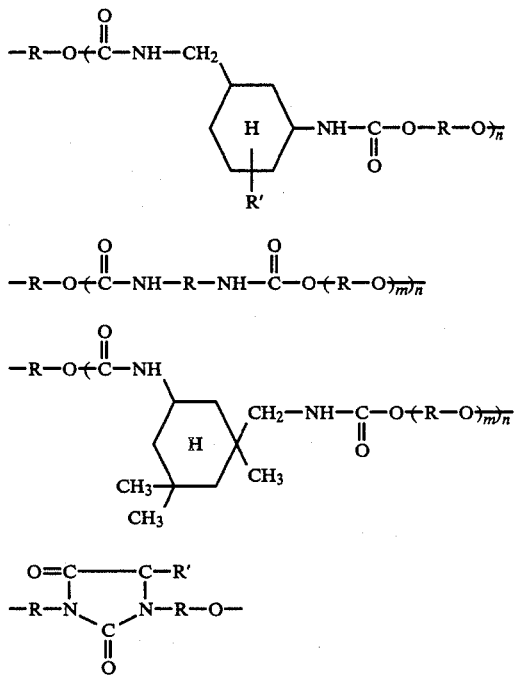

In the above formulas, R is an alkylene group, and R' is a hydrogen atom or an alkyl group, which may be substituted by phenylene or cyclohexylene. When a plurality of R or R' are present in the same structure, they may be the same or different groups.

The above units represent mere examples. X may suitably be selected taking the shape or properties of the device into consideration.

The photo-curable compounds may be used alone or in combination as a mixture of a plurality of compounds. Such a photo-curable vinyl compound may contain a modifier required for the preparation of a device, or a modifier for the prepared device. Specifically, it may contain a cross-linking agent, a surfactant, a diluting agent, a thickner, a defoarming agent, an adhesive, a stabilizer, an absorber, a colorant, a polymerization accelerator, a chain transfer agent or a polymerization inhibitor.

The photo-curable compound to be used for the device of the present invention may be suitably selected among various materials which meet the above requirements, taking into consideration the refractive index of the liquid crystal material and the compatibility with the liquid crystal material.

As the photo-cure initiator, a benzoin ether-type, a benzophenone-type, an acetophenone-type or a thioxanthone-type initiator may be mentioned.

The liquid crystal material used in the present invention may be nematic liquid crystal or smectic liquid crystal, and it may be used alone or may be used in the form of a composition. However, in order to satisfy various requirements such as the operational temperature range and the operational voltage, it is advantageous to use it in the form of a composition.

The liquid crystal material is desired to be uniformly dissolved with the photo-curable compound and insoluble or hardly soluble with the cured product formed by the irradiation with light. When a composition is used, it is preferred that the solubility of individual liquid crystal materials is close to one another.

For the preparation of a device of the present invention, the photo-curable compound and the liquid crystal material may be mixed in a weight ratio of from 5:95 to 45:55, and the mixture may be used in the form of a liquid or a viscous liquid. Namely, for the preparation of the device of the present invention, the mixture of the photo-curable compound and the liquid crystal material may be prepared in the form of a liquid or a viscous liquid. The optimum condition may be selected depending upon the particular method for the preparation of the device. For example, for a cell comprising a pair of glass substrates provided with transparent electrodes made of e.g. $In_2O_3$-$SnO_2$ or $SnO_2$, facing to each other and sealed along their periphery, it is usually convenient that the mixture is injected in a liquid form. Otherwise, when the mixture is coated on one of the substrates made of e.g. a plastic or glass provided with transparent electrodes and then the other substrate is overlaid thereon, it is usually convenient to employ the mixture in a viscous state.

The device may be operable with a cell gap of from 5 to 100 μm. However, taking the applied voltage and the contrast between the on and off states, the cell gap is preferably set within a range of from 7 to 40 μm. Then, the mixture held between the substrates is irradiated with light to fix the liquid crystal material and the cured product in their phase separated state. When the refractive index of the cured product is adjusted to agree to $n_0$ or $n_e$ of the liquid crystal material, the mixture held between the substrates which was uniformly dissolved and colorless transparent prior to the irradiation with light, turns into a turbid state after the irradiation with light, because light is scattered due to the difference in the refractive index between the non-oriented liquid crystal material and the cured product. The device of the present invention thus prepared is operable in such a manner that when a voltage is applied, the liquid crystal material will be aligned and the refractive index will agree to the refractive index of the cured product, whereby the device will be in a light transmitting state.

In the present invention, the curing of a photo-curable compound by irradiating light is conducted while applying a voltage to only the portion where a specific orientation is desired to be formed. The specific orientation may be formed by various methods.

(1) Electrodes may be disposed to correspond to the pattern of the specific portion, and while applying a voltage across the electrodes to the specific portion, the entire mixture is cured by irradiation.

(2) A light shielding mask is formed to cover the entire mixture except for the specific portion, and while applying a voltage to at least the specific portion, the entire mixture is irradiated to cure only the specific portion. Then, the light shielding mask is removed, and the rest of the mixture is cured.

(3) A laser or the like is scanned under application of a voltage to the necessary portion to form the specific orientation at the specific portion only.

Further, these methods may be used in a suitable combination. Otherwise, it is possible to firstly cure the mixture except for the specific portion by masking the specific portion, and then to cure the specific portion without masking under application of a voltage to at least the specific portion.

It is possible to employ an ordinary cell structure for a liquid crystal optical device having electrodes formed on the inner surfaces of substrates, and the specific orientation with a specific pattern may be formed by using the electrodes. Otherwise, electrodes may be disposed on the outer surfaces of the substrates, and the specific orientation with a specific pattern may be formed by using such electrodes. By using such means, it is possible to combine a dot matrix display, a segment display or a bar graph display with a design, or to form a continuous frame.

Further, by using an ITO-provided disc shaped glass substrate cell, it is possible to write-in with a laser beam or the like by using the above-mentioned method (3) while rotating the disc shaped cell about the center, whereby the device can be used as a memory element.

As mentioned above, it is further possible to change the voltage for curing stepwise in the vicinity of the threshold voltage or to control the irradiation time or the curing temperature to form a transmitting portion with an intermediate tone where the degree of turbidity is low but the transmittance can be changed by application of a voltage.

The device of the present invention thus prepared has a portion where light is always transmitted because of the specific orientation and a portion which is usually in a turbid state or in a transmitting state, where the transmittance varies upon application of a voltage in such a manner that upon application of a voltage, liquid crystal molecules align so that refractive index of the cured product agrees to the refractive index of the liquid crystal to form a transmitting state, or so that the refractive index of the cured product disagrees to the refractive index of the liquid crystal to form a turbid state.

Otherwise, liquid crystal molecules may be substantially aligned with inclination at a certain angle, on the average, relative to the substrates, whereby the device can be operated at a low operational voltage.

When the refractive index of the cured product is adjusted to agree to the refractive index ($n_x$) of the liquid crystal material, the mixture held between the substrates is colorless transparent prior to the irradiation with light if the mixture is uniformly dissolved, and it holds a light transmitting state after the irradiation with light because the refractive index of the non-oriented liquid crystal material agrees to the refractive index of the cured product. The device of the present invention thus prepared is operable in such a manner that when a voltage is applied, the liquid crystal material will be aligned, and the refractive index will disagree to the refractive index of the cured product, whereby light will be scattered to form a turbid state. At the specific portion where the specific orientation is formed, however, light is always scattered irrespective of application of a voltage. Of course, it is also possible to form a specific portion with an intermediate tone as mentioned above.

In the present invention, a certain color may be imparted, for instance, by incorporating a dichroic dye, a simple colorant or a pigment to the liquid crystal material, by using a colored material as the curable compound, by using colored substrates and the substrates, or by laminating a colored filter.

In the present invention, the liquid crystal material is used as a solvent, and the photo-curable compound is cured by irradiation with light, whereby it is unnecessary to evaporate a solvent or water during the curing. Thus, the curing can be conducted in a sealed system with high reliability, and the photo-curable compound effectively serves to bond the pair of the substrates, whereby a sealing agent may not be necessary.

Thus, it is possible to employ a production method having a high productivity which comprises supplying a mixture of the photo-curable compound and the liquid crystal material onto one of the substrates provided with electrodes, and then overlaying the other substrate thereon, followed by irradiation with light for curing.

In particular, by using plastic substrates as the substrates provided with electrodes, it is possible to readily produce an elongated liquid crystal optical device wherein a continuous plastic film is used.

By using such a liquid crystal material uniformly distributed in a matrix of the curved product, there will be no substantial danger that the top and bottom transparent electrodes are short-circuited even when the device is made to have a large surface area. Further, it is unnecessary to strictly control the alignment or the cell gap as required by ordinary twist nematic type liquid crystal display devices. Thus, a liquid crystal light-controlling device having a large surface area may be produced with extremely good productivity. To minimize irregularities in the light transmission, the cell gap is preferably set to be constant. For this purpose, it is preferred to place a spacer for a cell gap, such as glass particles, plastic particles or ceramic particles in the space between the substrates. Specifically such a spacer for a cell gap may be introduced as contained in the solution of the nematic liquid crystal material and the photo-curable vinyl compound, or it may be introduced before or after the supply of the solution onto one of the substrates and prior to the other substrate is overlaid thereon. In this case, pressure is preferably exerted after the overlaying, followed by curing to obtain a uniform cell gap.

Such a liquid crystal optical device may be used as a display device. However, since it is readily made to have a large surface area, and it may be cut into a desired size, it is particularly effective for use as a light-controlling device. When it is used as a light-controlling device, it is usually a transmitting mode, whereby transparent electrodes are employed. Of course, a metal lead may be provided thereto to reduce the resistance. When the device is used as a light-controlling mirror, one of the electrodes may be made to be a reflective electrode.

Various modifications may be applied to such a liquid crystal optical device. For instance, when the substrates are made of plastic or thin glass, a protective sheet made of plastic or glas may be laminated thereon for its protection, or the substrates may be made of a tempered glass, a laminated glass or a wired glass.

It is particularly preferred that a liquid crystal optical device is prepared by using plastic substrates as the substrates provided with electrodes, electrode leads are provided, the assembly is sandwiched between a pair of glass sheets which are slightly larger than the liquid crystal optical device with an adhesive material such as polyvinyl butyral interposed therebetween, then the adhesive material layer is cured by heating or radiation with light to integrate the liquid crystal optical device and the glass sheets in the form of a laminated glass. It is particularly preferred to use polyvinyl butyral as the adhesive material, whereby it is possible to obtain a structure which is very similar to a usual laminated glass.

To prepare such a liquid crystal optical device, a pair of substrates having a desired shape may be prepared and the liquid crystal optical device may be prepared by combining the pair of substrates. Otherwise, it may be prepared by using a continuous plastic film substrate, or it is possible to employ a method wherein the device is prepared by using an elongated glass substrate, and then cut into a desired size.

A light-controlling device of such a liquid crystal optical device may be used as a building material such as a window, a skylight, a partition or a door, as a material for vehicles such as a window or a sunroof, or as a material for a casing for various electrical products, a door or a closure.

The liquid crystal optical device of the present invention may be operated in such a manner that when a voltage is applied for operation, an AC voltage is applied to change the alignment of the liquid crystal. More particularly, an AC voltage of from 5 to 100 V at from 10 to 1,000 Hz may be applied.

When no voltage is applied, the electrodes may be open or short-circuited. It is preferred that the impedance between the electrodes i.e. the total impedance including the electrode impedance, the connection impedance at the terminals and the circuit impedance, is made lower than the impedance of the layer comprising the liquid crystal material and the cured product, whereby the response of the liquid crystal material upon the switching off of the voltage is quick.

In particular, it is preferred that the impedance between the electrodes is made to be not higher than 1/10 of the impedance of the layer comprising the liquid crystal material and the cured product. For this purpose, when the electrode impedance and the connection impedance at the terminals are high, it is preferred to lower the circuit impedance. By establishing such a self discharge circuit, an electric charge accumulated between the electrodes can quickly be discharged and will not hinder the movement of the liquid crystal to return to the random orientation, and the change between the transmission and the scattering will be quick, even when the capacitance of the device itself is substantially large as compared with usual liquid crystal display devices.

The device of the present invention is useful as a display device, particularly as a large surface area display device or as a curved surface display device, which used to be difficult with conventional liquid crystal display devices. Further, it is useful for many applications such as a light-controlling device with a large surface area or a light shutter. Furthermore, it is useful for an application wherein it is disposed in front of a light source such as an electric bulb to conduct switching between a fog lamp and a usual lamp electrically.

In the present invention, one of the electrodes may be used as a specular reflection electrode in the form of a mirror. In this case, the rear substrate may be made of a non-transparent glass, plastic, ceramic or metal.

Further, a color may be provided by using a colored filter or by incorporating a dichloric dye to the liquid crystal material.

Otherwise, it may be used as laminated on other display such as a TN liquid crystal display device, an electrochromic display device or an electroluminescence display device.

Thus, the display of the present invention may have various applications.

Now, the present invention will be described in further detail with reference to Examples. However, it should be understood that the present invention is by no means restricted by such specific Examples. In the Examples, "parts" means "parts by weight".

EXAMPLE 1

To 1 part of n-butyl acrylate and 5 parts of 2-hydroxyethyl acrylate, 18 parts of a liquid crystal material (E-8, manufactured by BDH Co.) and 0.12 part of benzoin isopropyl ether as a photo-cure initiator were uniformly dissolved, and the solution was injected into an ITO-provided glass substrate cell having a cell gap of 25 $\mu$m. The injection hole was sealed, and then a black colored tape with letter T cut out was attached to the cell as a light shielding mask. The entire cell was irradiated by a ultraviolet ray irradiation apparatus (Toscure 400, trade name, manufactured by Toshiba) for about 3 seconds under application of AC 60 V (50 Hz). Then, the black colored tape was removed, the cell was irradiated by the ultraviolet ray irradiation apparatus for about 60 seconds without applying a voltage, whereby a device having a transparent portion of letter T and the rest being turbid was obtained. When AC 60 V (50 Hz) was applied, this device showed a transparent state over the entire area.

EXAMPLE 2

One part of n-butyl acrylate, 3 parts of 2-hydroxyethyl acrylate, 4 parts of an acyl oligomer (M-1200, manufactured by Toa Gosei Kagaku K.K.), 0.16 part of a photo-cure initiator (Darocur 1116, trade name, manufactured by Merck Co.) and 4 parts of a liquid crystal material (E-8) were uniformly dissolved. The solution was injected into a $SnO_2$ electrode-provided glass substrate cell with a cell gap of 25 $\mu$m. The injection hole was sealed, and then the entire cell was irradiated by a ultraviolet ray irradiation apparatus for about 15 seconds under application of an AC voltage of 50 Hz. The applied voltage was changed to various levels. Then, the cell was irradiated by the ultraviolet ray irradiation apparatus for about 60 seconds without application of a voltage, to complete the curing. The changes in the transmittance of the liquid crystal optical device thus prepared depending upon the voltage applied during the curing operation are shown in Table 1. The transmittance for "on" was measured under application of AC 60 V (50 Hz).

TABLE 1

| Applied voltage (V) | $T_{OFF}$ (%) | $T_{ON}$ (%) |
| --- | --- | --- |
| 0 | 8.1 | 54.6 |
| 0.25 | 8.4 | 50.4 |
| 0.3 | 8.3 | 50.5 |
| 0.5 | 9.2 | 54.8 |
| 1.0 | 15.8 | 59.8 |
| 1.5 | 18.5 | 60.1 |
| 3.0 | 28.5 | 67.6 |
| 5.0 | 44.4 | 73.0 |
| 10.0 | 54.1 | 75.6 |
| 20.0 | 61.8 | 75.4 |
| 30.0 | 64.1 | 75.0 |
| 40.0 | 64.7 | 75.0 |
| 50.0 | 65.9 | 75.0 |
| 60.0 | 67.2 | 75.8 |

EXAMPLE 3

Seven parts of the mixture as used in Example 1 and 3 parts of polyvinyl alcohol were dispersed in water, and the dispersion was cast on an ITO-provided polyethylene terephthalate film. After evaporating water therefrom, an ITO-provided polyethylene terephthalate film was overlaid thereon. The cell gap was 20 μm.

AC 60 V (50 Hz) was applied to the device thus obtained in the same manner as in Example 1, whereby the entire area became a transparent state, and when the voltage was switched off, the portion of letter T was transparent and the rest was in a turbid state.

EXAMPLE 4

One part of N-(n-butoxymethyl)acrylamide, 3 parts of n-butyl acrylate, 0.2 part of a photo-cure initiator (Darocur 1116) and 9.5 parts of liquid crystal TN-623 manufactured by Roche Co. were uniformly dissolved. A device was prepared in the same manner as in Example 1 except that the cell gap was changed to 10 μm. When AC 60 V (50 Hz) was applied, this device showed a transparent state over the entire area. When the voltage was switched off, the portion of letter T was transparent, and the rest was in a turbid state.

EXAMPLE 5

By using the same cell as used in Example 1, a black colored light-shielding tape with a square cut out was attached on the cell surface and five circular black colored tapes having different sizes were concentrically attached within the square space. Then, the entire cell was irradiated by the ultraviolet ray irradiation apparatus for about 3 seconds under application of AC 60 V (50 Hz). Then, the black colored tapes were removed, and the cell was irradiated by the ultraviolet ray irradiation apparatus for about 60 seconds without application of a voltage, whereby a device with the square frame and concentric circular portions being turbid and the rest being transparent was obtained. When AC 60 V (50 Hz) was applied, this device showed a response only at the frame and concentric circular portions and the entire cell became transparent.

Further, by changing the location of the black colored tapes, it is also possible to obtain a device wherein the negative and positive positions in the above Example are reversed.

EXAMPLE 6

Three parts of n-butyl acrylate, 2 parts of an acryl oligomer (Viscoat #823, trade name, manufactured by Osaka Yuki Kagaku K.K., viscosity: 19,000 cps/50° C.), 3 parts of a liquid crystal material (E-8) and 0.1 part of a photo-cure initiator (Darocur 1116) were uniformly mixed, and the mixture was coated on an ITO-provided polyester film by means of a doctor blade. A spacer of 10 μm was applied thereto, and then an ITO-provided polyester film was overlaid thereon. Then, irradiation was conducted under the same conditions as in Example 1 to obtain a device. When AC 60 V (50 Hz) was applied, this device showed a transparent state over the entire area, and when the voltage was switched off, the portion of letter T was transparent, and the rest was in a turbid state.

EXAMPLE 7

One part of n-butyl acrylate, 5 parts of 2-hydroxyethyl acrylate, 3 parts of an acryl oligomer (M-6200, manufactured by Toa Gosei Kagaku K.K., viscosity: 240 cps/50° C.), 0.20 part of a photo-cure initiator (Darocur 1173, trade name, manufactured by Merck Co.) and 18 parts of a liquid crystal material (E-8) were uniformly dissolved. A device was prepared in the same manner as in Example 1 except that the thickness of the glass sheet for the cell was changed to 3.0 mm, and irradiation with light was changed to each 10 seconds and 3 minutes. When AC 60 V (50 Hz) was applied, this device showed a transparent state over the entire area, and when the voltage was switched off, the portion of letter T was transparent, and the rest was in a turbid state.

EXAMPLE 8

Seven parts of 2-ethyl-hexyl acrylate, 15 parts of 2-hydroxyethyl acrylate, 14 parts of an acryl oligomer (M-1200, manufactured by Toa Gosei Kagaku K.K., viscosity: 30,000 cps/50° C.), 0.9 parts of a photo-cure initiator (Darocur 1116) and 64 parts of a liquid crystal material (E-8) were uniformly dissolved. A spacer of 14 μm was added and thoroughly dispersed therein. The mixture was coated on an ITO-provided polyester film, and then an ITO-provided polyester film was overlaid thereon. Then, irradiation was conducted by a ultraviolet irradiation apparatus (Neolumisuper (30W), trade name, manufactured by Mitsubishi Denki K.K.) for about each 5 seconds and 90 seconds to obtain a device.

When AC 60 V (50 Hz) was applied, this device showed a transparent state over the entire area, and when the voltage was switched off, the portion of letter T was transparent, and the rest was in a turbid state.

Further, this device was sandwiched between a pair of a glass sheet with a pair of a polyvinyl butyral layer interposed therebetween, and the assembly was heated and pressed in an autoclave for integration.

The integrated device was safe against a pressure from outside and highly reliable.

EXAMPLE 9

A device was prepared in the same manner as in Example 8 except that the thickness of the spacer was changed to 8 μm. When AC 60 V (50 Hz) was applied, this device showed a transparent state over the entire area, and when the voltage was switched off, the portion of letter T was transparent, and the rest was in a turbid state. The background area of this device had a high transmittance under application of a voltage or without application of voltage, as compared with Example 8, since the cell gap was small as compared with Example 8.

EXAMPLE 10

With the device of Example 8, the response time in the change of the transmittance was 1.2 seconds when the circuit was opened from the state where a voltage of 50 V was applied. After switching off the voltage, the electrodes of the device were short-circuited with a resistance of 1 kΩ, the response time was 0.02 second.

EXAMPLE 11

A device was prepared in the same manner as in Example 8 except that 1.5 parts of a colored curable material (Bestcure 161, trade name, manufactured by Toka Shikiso Kagaku Kogyo K.K.) was added and dispersed.

A device colored uniformly over the entire surface except for the portion of letter T, was obtained. When AC 60 V (50 Hz) was applied, this device showed a transparent state over the entire area, and when the voltage was switched off, the portion of letter T was transparent, and the rest was in a turbid state.

EXAMPLE 12

One part of N-(n-butoxymethyl)acrylamide, 3 parts of n-butyl acrylate, 1 part of acryl oligomer (Viscoat #823), 0.2 part of a photo-cure initiator (Darocur 1116) and 9.5 parts of a liquid crystal material (TN-623, manufactured by Roche Co.) were uniformly dissolved. A device was prepared in the same manner as in Example 4. When AC 60 V (50 Hz) was applied, this device showed a transparent state over the entire area, and when the voltage was switched off, the portion of letter T was transparent, and the rest was in a turbid state.

In this device, an acryl oligomer was used as a starting material. As compared with the device obtained in Example 4, fine cracks after the curing were less, and the change in the transmittance upon application of a voltage was large.

EXAMPLE 13

Six parts of n-butyl acrylate, 16 parts of 2-hydroxyethyl acrylate, 11 parts of an acryl oligomer (M-1200), 1 part of benzophenone as a photo-cure initiator and 67 parts of liquid crystal (E-8) were uniformly dissolved. This solution was injected into an ITO electrode-provided glass substrate cell with a cell gap of 25 μm. The injection hole was sealed, and then the entire cell was irradiated by the ultraviolet ray irradiation apparatus for about 20 seconds under application of an AC voltage of 50 Hz. The applied voltage was changed to various levels. Then, the cell was irradiated by the ultraviolet irradiation apparatus for about 60 seconds without application of a voltage, to complete the curing. The dielectric constant ε of the liquid crystal optical device thus obtained is shown in Table 2. The dielectric constant of the liquid crystal optical device cured without application of a voltage was 10.1 as measured under an application of AC 0.7 V (1 kHz) (which corresponds to $\epsilon_{OFF}$), and the dielectric constant upon application of AC 50 V (1 kHz) was 15.5 (which corresponds to $\epsilon_{ON}$).

TABLE 2

| Voltage applied during the curing operation (V) | Dielectric constant AC 0.7 V (1 kHz) | Transmittance $T_{OFF}$ (%) 0 V | Transmittance $T_{ON}$ (%) AC 100 V 50 Hz | Operational voltage (V) | Response time (msec) |
|---|---|---|---|---|---|
| 0 | 10.1 | 11.2 | 74.3 | 21.2 | 5.8 |
| 1.0 | 11.9 | 16.8 | 76.2 | 20.0 | 5.0 |
| 2.0 | 13.2 | 33.2 | 78.6 | 18.8 | 3.0 |
| 100.0 | 17.3 | 75.0 | 84.0 | | |

In the Table, the operational voltage represents the voltage for transmittance of the following formula:

$$(T_{100\ V} - T_{0\ V})/2$$

where $T_{100\ V}$ is the transmittance when AC 100 V was applied, and $T_{0\ V}$ is the transmittance when no voltage was applied.

The response time in the Table represents the time for the transmittance to change from the minimum quantity of light (0 V) to 90% of the maximum quantity of light (AC 100 V).

EXAMPLE 14

Twelve parts of n-butyl acrylate, 24 parts of an acryl oligomer (M-1200), 1.4 parts of a photo-cure initiator (Darocur 1116) and 64 parts of liquid crystal (E-8) were uniformly dissolved. This solution was coated on an ITO-provided polyester film substrate tentatively adhered to a glass plate, and then an ITO-provided polyester film substrate likewise tentatively adhered to a glass plate was overlaid thereon to have a cell gap of 20 μm. Then, the entire cell was irradiated by the ultraviolet ray irradiation apparatus for about 120 seconds under application of AC 40 V (50 Hz).

The dielectric constant ε of the liquid crystal optical device prepared in the same manner as above except that the curing was conducted without application of a voltage was 8.2 as measured under application of AC 0.7 V (1 kHz) (which corresponds to $\epsilon_{OFF}$), and the dielectric constant ε as measured under application of AC 50 V (1 kHz) (which corresponds to $\epsilon_{ON}$) was 13.7.

TABLE 3

| Voltage applied during the curing operation (V) | Dielectric constant AC 0.7 V (1 kHz) | Transmittance $T_{OFF}$ (%) 0 V | Transmittance $T_{ON}$ (%) AC 100 V 50 Hz | Operational voltage (V) | Response time (msec) |
|---|---|---|---|---|---|
| 0 | 8.2 | 5.9 | 74.4 | 17.8 | 6.1 |
| 40.0 | 8.9 | 13.4 | 80.3 | 14.4 | 4.2 |

From this Table, it is evident that as compared with the Comparative Example where no voltage was applied during the curing operation, the Example of the present invention wherein the curing was conducted under application of AC 40 V is superior for low voltage operation, high speed response and high transmittance.

As described in the foregoing, the present invention provides a novel liquid crystal optical device and a process for its production. The liquid crystal optical device useful as a light-controlling device is prepared by irradiating light to a uniformly dissolved state of a liquid crystal material and a photo-curable compound selected so that the refractive index of the resulting cured product agrees to either the ordinary refractive index ($n_o$) or the extraordinary refractive index ($n_e$) of the liquid crystal material used, or the refractive index ($n_x$) of the liquid crystal material when it is randomly oriented, held between a pair of substrates provided with electrodes, to cure the photo-curable compound and fix the resulting phase separation of the liquid crystal material and the cured product. Thus, the present invention does not require a polarizing film and presents a device having excellent quality of the outer appearance and high productivity. It is useful for a display, particularly for a display having a large surface area or a curved surface, and it has also a wide range of application e.g. as a light-controlling device with a large surface area and as a light shutter.

Further, it is possible to display a specific character or design without patterning the electrodes. Furthermore, it is readily possible to enclose a character, design or graph by a continuous frame. Thus, there will be merits that the freedom of display can be expanded and the design of the display pattern can be facilitated.

Furthermore, when the photo-curing was conducted under application of a voltage in the vicinity of the threshold voltage or when the photo-curing is conducted in a short period of time under application of a voltage, it is possible to form a portion where the light is transmitted not completely but more than the surrounding masked portion or turbidity is higher than the surrounding portion. Thus, it is possible to obtain a display with an intermediate tone as opposed to the two value display of transmittance or turbidity.

Further, at the portion where such a specific orientation is formed, the operational voltage can be reduced and the response speed can be increased although the difference in the transmittance as between the application and non-application of the voltage decreases. Thus, it is possible to obtain a liquid crystal optical device operable at a low voltage by photo-curing the entire cell while applying a voltage over the entire cell surface.

When a light-curable vinyl compound is employed in the present invention, the device is highly reliable, and since it has a structure of a laminated glass, it is highly safe as being hardly susceptible to breakage by a pressure from outside.

Further, the safety will be improved by providing a protective sheet on at least one side of the substrates. The device will be hardly breakable when such a protective sheet is provided on each side.

By supplying a mixture of the liquid material, the photo-curable compound particularly the photo-curable vinyl compound and optionally a photo-cure initiator onto one of the substrates and overlaying the other substrate thereon, a device having a large surface area can readily be prepared with high productivity. Accordingly, even in the case of glass substrates, fairly elongated substrates may be employed, and in the case of plastic substrates, it is possible to employ a continuous process by using continuous plastic films.

Especially when plastic substrates are used as the substrates, the strength will be poor although the productivity will be high, and when made to have a large surface area, the device will be susceptible to breakage or likely to be bent. Therefore, it is effective to provide a protective sheet on each side. It is particularly preferred to use a glass sheet as the protective sheet, and by bonding a glass sheet by means of an adhesive material, it is possible to obtain a structure similar to a laminated glass, which is highly safe and reliable.

In the liquid crystal optical device of the present invention by using a photo-curable vinyl compound, the liquid crystal material and the cured vinyl compound form a fine three-dimensional network matrix, and such a device can be cut into a desired size for use.

The present invention can be used for various other applications within a range where the effects of the present invention will not be impaired.

What is claimed is:

1. A liquid crystal optical device comprising a pair of substrates provided with electrodes and a layer containing a liquid crystal material sandwiched between the pair of substrates, wherein said layer is formed by irradiating light to a mixture of a liquid crystal material and a photo-curable compound selected so that the refractive index of the resulting cured product agrees to either the ordinary refractive index ($n_o$) or the extraordinary refractive index ($n_e$) of the liquid crystal material used, or the refractive index ($n_x$) of the liquid crystal material when it is randomly oriented, held between the pair of substrates provided with electrodes, to cure the photo-curable compound and fix the resulting phase separation of the liquid crystal material and the cured product, wherein said layer has at least a portion optically oriented by applying a voltage to the portion across the substrates during the irradiation of light to cure the photo-curable compound.

2. The liquid crystal optical device according to claim 1, wherein the photo-curable compound is selected so that the refractive index of the resulting cured product agrees to the ordinary refractive index ($n_o$) or the extraordinary refractive index ($n_e$) of the liquid crystal material used.

3. The liquid crystal optical device according to claim 2, wherein at the optically oriented portion, liquid crystal molecules are aligned substantially perpendicular to the substrates so that light is always transmitted through the portion irrespective of application of a voltage higher than the threshold voltage.

4. The liquid crystal optical device according to claim 2, wherein at the optically oriented portion, liquid crystal molecules are aligned substantially with inclination at a certain angle, on the average, to the substrates so that light is scattered when no voltage is applied, and the transmittance and scattering of light can be controlled by the application or non-application of a voltage higher than the threshold voltage.

5. The liquid crystal optical device according to claim 1, wherein the photo-curable compound is selected so that the refractive index of the resulting cured product agrees to the ordinary refractive index ($n_o$) of the nematic liquid crystal material used, and the nematic liquid crystal material has a positive dielectric anisotropy.

6. The liquid crystal optical device according to claim 1, wherein the mixture of a liquid crystal material and a photo-curable compound is a solution of the photo-curable compound in the liquid crystal material.

7. The liquid crystal optical device according to claim 1, wherein the photo-curable compound is a photo-curable vinyl compound.

8. The liquid crystal optical device according to claim 1, wherein the photo-curable compound is an acrylate compound.

9. The liquid crystal optical device according to claim 1, wherein the photo-curable compound contains from 15 to 70% by weight of an acryl oligomer.

10. The liquid crystal optical device according to claim 1, wherein the layer containing a liquid crystal material contains a spacer to secure a cell gap.

11. The liquid crystal optical device according to claim 1, wherein the substrates provided with electrodes are plastic substrates provided with transparent electrodes.

12. The liquid crystal optical device according to claim 11, wherein a protective sheet is laminated on the outer side of at least one of the plastic substrates.

13. The liquid crystal optical device according to claim 11, wherein a protective sheet is laminated on the outer side of each of the plastic substrates.

14. The liquid crystal optical device according to claim 13, wherein the glass sheet is bonded by polyvinyl butyral to each plastic substrate integrally in the form of a laminated glass.

15. A process for producing a liquid crystal optical device, which comprises supplying a mixture of a liquid crystal material and a photo-curable compound selected so that the refractive index of the resulting cured product agrees to either the ordinary refractive index ($n_0$) or the extraordinary refractive index ($n_e$) of the liquid crystal material used, or the refractive index ($n_x$) of the liquid crystal material when it is randomly oriented, between a pair of substrates provided with electrodes and irradiating the mixture with light to cure the photo-curable compound and form a cured layer of the mixture, wherein a voltage is applied to at least a portion of the mixture across the substrates during the irradiation so that only said portion is optically oriented upon curing.

16. The process according to claim 15, wherein the photo-curable compound is selected so that the refractive index of the resulting cured product agrees to the ordinary refractive index ($n_0$) or the extraordinary refractive index ($n_e$) of the liquid crystal material used.

17. The process according to claim 16, wherein the irradiation is conducted under application of a voltage substantially higher than the threshold voltage so that at the optically oriented portion, liquid crystal molecules are aligned substantially perpendicular to the substrates so that light is always transmitted through the portion irrespective of application of a voltage higher than the threshold voltage.

18. The process according to claim 16, wherein the irradiation is conducted under application of a voltage close to or higher than the threshold voltage so that at the optically oriented portion, liquid crystal molecules are aligned substantially with inclination at a certain angle, on the average, to the substrates so that light is scattered when no voltage is applied, and the transmittance and scattering of light can be controlled by the application or non-application of a voltage higher than the threshold voltage.

19. The process according to claim 16, wherein the mixture of a liquid crystal material and a photo-curable compound is a solution of the photo-curable compound in the liquid crystal material.

20. The process according to claim 15, wherein the photo-curable compound is selected so that the refractive index of the resulting cured product agrees to the ordinary refractive index ($n_0$) of the liquid crystal material used, and the liquid crystal material has a positive dielectric anisotropy.

21. The process according to claim 15, wherein the mixture of the liquid crystal material and the photo-curable compound is supplied onto one of the substrates provided with electrodes, and then, the other substrate is overlaid thereon, followed by the irradiation with light to cure the photo-curable compound.

22. The process according to claim 21, wherein a spacer to secure a cell gap is introduced together with the mixture, or before or after the supply of the mixture onto one of the substrates and prior to the overlaying of the other substrate.

23. The process according to claim 15, wherein the irradiation is conducted firstly to cure said portion of the mixture by masking the mixture other than said portion and applying a voltage across the electrodes of the substrates corresponding to at least said portion, and then to cure the rest of the mixture without masking and without application of a voltage.

24. The process according to claim 15, wherein the irradiation is conducted firstly to cure said portion of the mixture by masking the mixture other than said portion and applying a voltage across the electrodes of the substrates covering the entire mixture, and then to cure the rest of the mixture without masking and without application of a voltage.

25. The process according to claim 15, wherein the irradiation is conducted firstly to cure the mixture except for said portion of the mixture by masking said portion, and then to cure said portion of the mixture without masking and by applying a voltage across the electrodes of the substrates corresponding to at least said portion.

26. The process according to claim 15, wherein the irradiation is conducted firstly to cure the mixture except for said portion of the mixture by masking said portion, and then to cure said portion of the mixture without masking and by applying a voltage across the electrodes of the substrates covering the entire mixture.

27. The process according to claim 15, wherein the irradiation is conducted under application of a voltage across the entire electrodes of the substrates.

28. The process according to claim 15, wherein the photo-curable compound is an acrylate compound.

29. The process according to claim 15, wherein the photo-curable compound contains from 15 to 70% by weight of an acryl oligomer.

* * * * *